(12) United States Patent
Tsukio et al.

(10) Patent No.: US 8,390,334 B2
(45) Date of Patent: Mar. 5, 2013

(54) SYNTHESIZER AND RECEPTION DEVICE AND ELECTRONIC DEVICE USING THE SAME

(75) Inventors: Yasunobu Tsukio, Osaka (JP); Akihiko Namba, Osaka (JP)

(73) Assignee: Panasonic Corporation, Osaka (JP)

( * ) Notice: Subject to any disclaimer, the term of this patent is extended or adjusted under 35 U.S.C. 154(b) by 86 days.

(21) Appl. No.: 13/057,055

(22) PCT Filed: Aug. 26, 2009

(86) PCT No.: PCT/JP2009/004104
§ 371 (c)(1),
(2), (4) Date: Feb. 1, 2011

(87) PCT Pub. No.: WO2010/023883
PCT Pub. Date: Mar. 4, 2010

(65) Prior Publication Data
US 2011/0133798 A1    Jun. 9, 2011

(30) Foreign Application Priority Data
Aug. 28, 2008   (JP) ................................ 2008-219157

(51) Int. Cl.
*H03B 21/00*   (2006.01)
(52) U.S. Cl. .......................... 327/105; 327/106; 327/107
(58) Field of Classification Search .................. 327/105, 327/106, 107
See application file for complete search history.

(56) References Cited

U.S. PATENT DOCUMENTS

| 8,040,178 | B2 * | 10/2011 | Tsukio et al. ................. 329/325 |
| 2004/0232997 | A1 * | 11/2004 | Hein et al. ...................... 331/16 |
| 2009/0029662 | A1 | 1/2009 | Tsukio et al. | |

FOREIGN PATENT DOCUMENTS

| CN | 101032087 A | 9/2007 |
| JP | 03-209917 A | 9/1991 |
| JP | 07-245563 A | 9/1995 |
| JP | 2003-069426 A | 3/2003 |
| JP | 2007-175577 A | 7/2007 |

OTHER PUBLICATIONS

International Search Report for PCT/JP2009/004104, Oct. 27, 2009.

* cited by examiner

*Primary Examiner* — John Poos
(74) *Attorney, Agent, or Firm* — RatnerPrestia

(57) ABSTRACT

A synthesizer includes: a synthesizer unit that outputs an oscillation signal based on a reference oscillation signal; a temperature detecting unit that detects a temperature; a time variation detecting unit that detects a time variation in frequency of the reference oscillation signal based on a result of temperature detection by the temperature detecting unit; and a control unit that adjusts a frequency of the oscillation signal outputted from the synthesizer unit based on a result of detection by the time variation detecting unit. With such a configuration, frequency compensation control is performed on a transducer having a large temperature coefficient.

10 Claims, 6 Drawing Sheets

US 8,390,334 B2

SYNTHESIZER AND RECEPTION DEVICE AND ELECTRONIC DEVICE USING THE SAME

This application is a U.S. NATIONAL PHASE APPLICATION OF PCT INTERNATIONAL APPLICATION No. PCT/W2009/004104

TECHNICAL FIELD

The present invention relates to a synthesizer, a receiving device and electronic equipment.

BACKGROUND ART

Hereinafter, a conventional synthesizer is described with reference to FIG. 6. FIG. 6 is a block diagram of a conventional synthesizer. In FIG. 6, synthesizer 60 has: phase comparator 61 that outputs a pulse width signal proportional to a phase difference between a reference oscillation signal outputted from reference oscillator 69 and a comparison signal outputted from later-mentioned frequency divider 64; loop filter 62 that receives the pulse width signal and outputs a low-pass filtered signal; VCO 63 that outputs an oscillation signal based on the low-pass filtered signal; and frequency divider 64 that divides the oscillation signal based on a frequency division ratio set by later-mentioned control unit 68, and outputs a comparison signal. These constitute a phase locked loop (hereinafter referred to as "PLL").

Further, synthesizer 60 has: temperature detecting unit 65 that detects an ambient temperature of reference oscillator 69; AD converter 66 that converts the detected temperature to digitalized temperature information; nonvolatile memory 67 that stores frequency division ratio information corresponding to the temperature information; and control unit 68 that sets a frequency division ratio of frequency divider 64 based on the frequency division ratio information.

With such a configuration, even when a frequency of the reference oscillation signal changes depending on the ambient temperature of reference oscillator 69, it is possible to perform control (hereinafter referred to as "frequency compensation control") to hold an oscillation signal, outputted from synthesizer 60, at a fixed value. In the PLL included in synthesizer 60, when the frequency of the reference oscillation signal is Fref and the frequency division ratio is M, frequency Fvco of the oscillation signal outputted from synthesizer 60 is expressed by (Equation 1):

$$Fvco = Fref \times M \quad \text{(Equation 1)}$$

Herein, Fref is a function of temperature. By means of this relation, when the ambient temperature of reference oscillator 69 changes to cause an increase in Fref by "a" times, M is set to 1/a times so that Fvco can be held at a fixed value despite the change in temperature. Therefore, the frequency compensation control can be performed in such a manner that a combination table for frequency division ratio M, intended to make the ambient temperature of reference oscillator 69 and Fvco fixed values, is previously written into nonvolatile memory 67, and frequency division ratio M read from nonvolatile memory 67 corresponding to a temperature detected by temperature detecting unit 65 is set into frequency divider 64 by control unit 68. As for prior art document information relative to the invention of this application, for example, Patent Document 1 is known.

However, in the above conventional controlling method, the oscillation signal outputted from synthesizer 60 may generate a frequency variation width not smaller than a predetermined value, to have an adverse effect on processing by a signal processing unit (not shown) connected to a subsequent stage to synthesizer 60.

PRIOR ART DOCUMENT

Patent Document

[Patent Document 1] Unexamined Japanese Patent Publication No. H03-209917

DISCLOSURE OF THE INVENTION

A synthesizer of the present invention has: a synthesizer unit that outputs an oscillation signal based on a reference oscillation signal; a temperature detecting unit that detects a temperature; a time variation detecting unit that detects a time variation in frequency of the reference oscillation signal based on a result of temperature detection by the temperature detecting unit; and a control unit that adjusts a frequency of the oscillation signal outputted from the synthesizer unit based on a result of detection by the time variation detecting unit.

With the above configuration, it is possible to hold a frequency variation width of an oscillation signal outputted from the synthesizer at or below a predetermined value, so as to suppress an adverse effect on a signal processing unit in a subsequent stage.

PREFERRED EMBODIMENTS FOR CARRYING OUT OF THE INVENTION (Embodiment 1)

Figure 1:
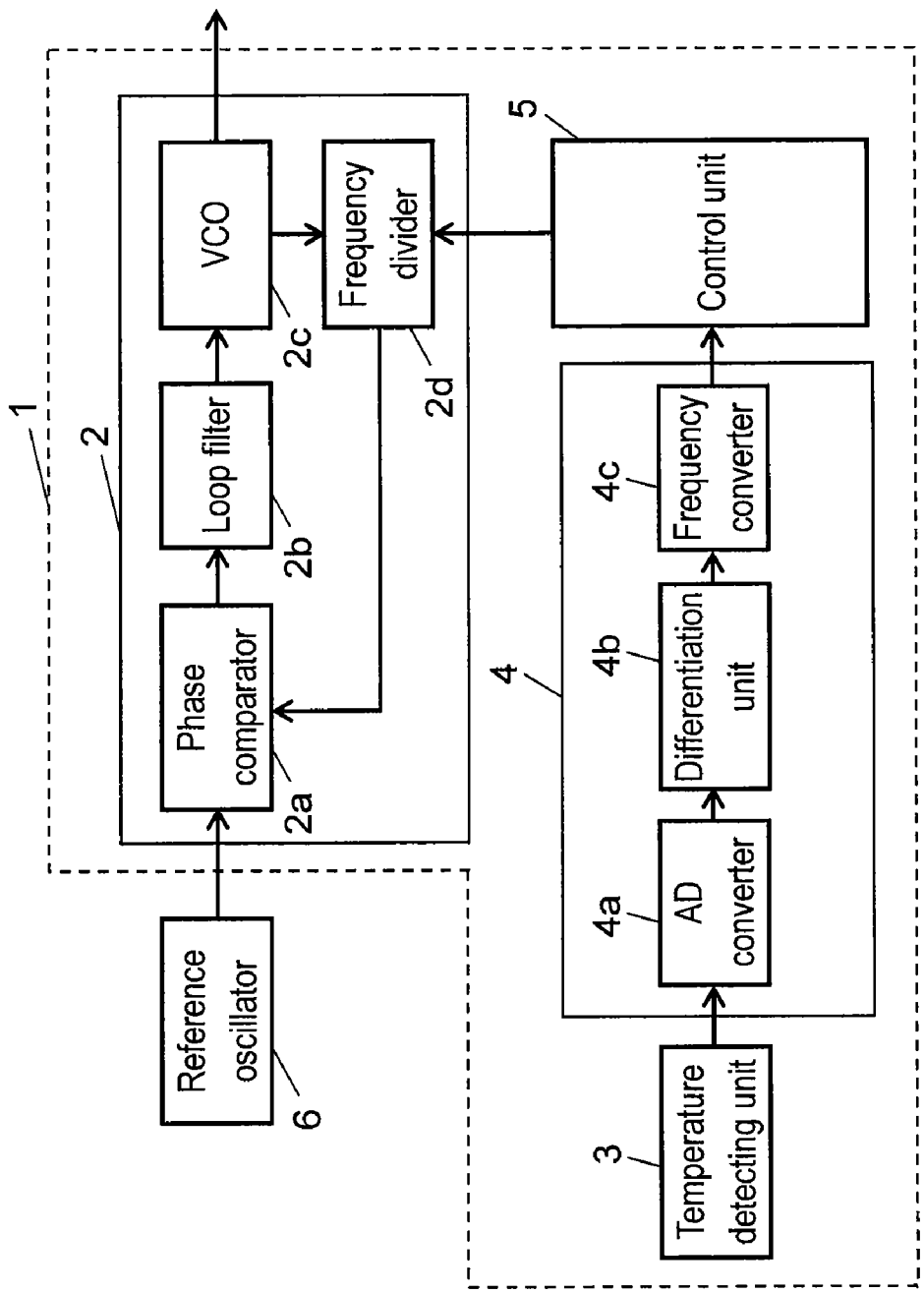
FIG. 1 is a block diagram of a synthesizer in Embodiment 1 of the present invention.

FIG. 1 is a block diagram of a synthesizer in Embodiment 1 of the present invention. In FIG. 1, synthesizer 1 has: synthesizer unit 2 that outputs an oscillation signal based on a reference oscillation signal outputted from reference oscillator 6 and a frequency division ratio set by control unit 5; temperature detecting unit 3 that detects an ambient temperature of reference oscillator 6; time variation detecting unit 4 that detects a time variation in frequency of the reference oscillation signal based on a result of temperature detection by temperature detecting unit 3; and control unit 5 that adjusts a frequency of the oscillation signal outputted from synthesizer unit 2 based on the time variation. Further, synthesizer unit 2 has: phase comparator 2a that outputs a pulse width signal proportional to a phase difference between a reference oscillation signal outputted from reference oscillator 6 and a comparison signal; loop filter 2b that receives the pulse width signal and outputs a low-pass filtered signal; VCO 2c that outputs an oscillation signal based on the low-pass filtered signal; and frequency divider 2d that divides the oscillation signal based on the frequency division ratio set by control unit 5, and outputs a comparison signal. These constitute a phase locked loop (PLL). Further, time variation detecting unit 4 has: AD converter 4a that converts the detected temperature outputted from temperature detecting unit 3 to a digital signal; differentiation unit 4b that performs time differentiation on this temperature having been converted to the digital signal; and frequency converter 4c that outputs an amount of time variation in frequency of the reference oscillation signal from the time differential value.

Figure 2:
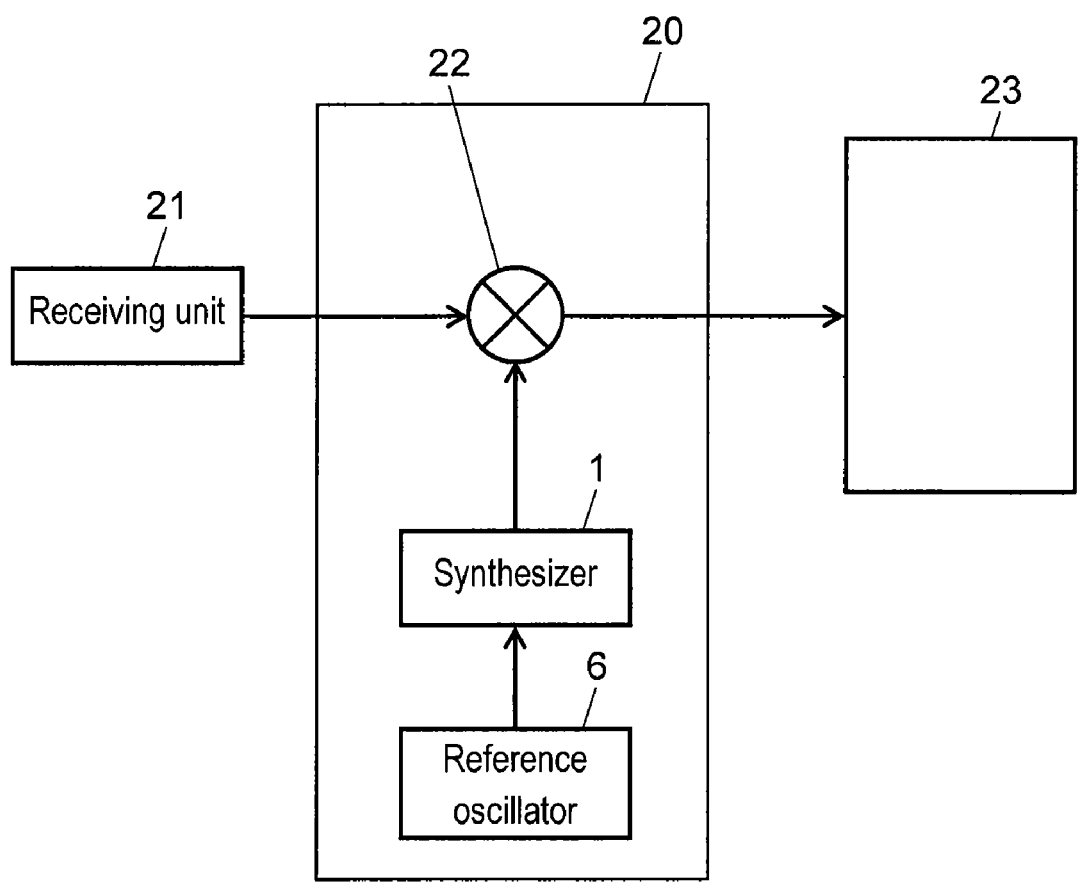
FIG. 2 is a block diagram of a receiving device mounted with the synthesizer in Embodiment 1 of the present invention.

FIG. 2 is a block diagram of a receiving device mounted with the synthesizer in Embodiment 1 of the present invention. In FIG. 2, receiving device 20 has: reference oscillator 6 that outputs a reference oscillation signal; synthesizer 1 that outputs an oscillation signal based on the reference oscillation signal; and frequency converter 22 that converts a received signal outputted from receiving unit 21 to a frequency based on the oscillation signal outputted from synthesizer 1, and outputs a base band signal (hereinafter referred to as "BB signal") to signal processing unit 23. It is to be noted that frequency converter 22 may output a signal of a specific frequency, and the output signal may be converted to a BB signal by use of a second frequency converter (not shown) connected to a subsequent stage to frequency converter 22.

Herein, when the frequency of the oscillation signal outputted from synthesizer 1 varies, the variation may have an adverse effect on signal processing performed by signal processing unit 23. For example, in the case of receiving digital terrestrial broadcasting (ISDB-T) in Japan, the BB signal is subjected to primary modulation by 64 QAM or the like and secondary modulation by OFDM, and signal processing unit 23 performs demodulation processing on this modulated BB signal. The variation in frequency of the oscillation signal destroys orthogonality among carriers constituting the OFDM, and gives a variation in phase of the modulation by the 64 QAM or the like. This brings about deterioration in performance of the demodulation processing, to cause generation of noise in a video display. The relation between an amount of variation in frequency of the oscillation signal and an amount of deterioration in performance of the demodulation processing differs depending on systems. In the ISDB-T, since an interval between each carrier constituting the OFDM is about 1 kHz (in the case of Mode 3), when the frequency of the oscillation signal varies by not less than ±500 Hz, wrong discrimination may be made from an adjacent carrier. Further, in order to make small the effects exerted by the inter-carrier interference and the variation in phase, for example, the variation in frequency is desirably held at or below ±50 Hz, that is one-tenth of the above. Therefore, when an allowable frequency deviation determined in accordance with processing performance of signal processing unit 23 is $\Delta$Fmax, control unit 5 needs to perform frequency compensation control in units not larger than $\Delta$Fmax.

In the case of the frequency compensation control by conventional synthesizer 60, in order to hold a variation in frequency Fvco (Hz) of an oscillation signal outputted from synthesizer 60 at or below $\Delta$Fmax (Hz) by use of a reference oscillation signal with a frequency temperature characteristic being X (ppm/° C.), temperature detection accuracy Z (° C.) of temperature detecting unit 65 needs to satisfy (Equation 2):

$$Z \leq (\Delta F\text{max}/F\text{vco})/X \qquad \text{(Equation 2).}$$

When reference oscillator 69 is configured using an AT-cut crystal transducer in conventional use, frequency temperature characteristic X in the vicinity of a normal temperature of the reference oscillation signal is 0.1 (ppm/° C.) at most. Therefore, in a UHF band (470 to 770 MHz) used in the ISDB-T, the temperature detection accuracy of temperature detecting unit 3 is "Z≤0.65° C." for realizing "$\Delta$Fmax=50 Hz". With the temperature detection accuracy of ±0.5° C. realizable even by a semiconductor-based simple temperature detecting unit, the condition of (Equation 2) can be satisfied, and deterioration in processing performance of signal processing unit 23 has not become an issue.

However, when reference oscillator 69 is configured using a transducer with a large temperature characteristic, temperature detection accuracy Z becomes small, and the frequency compensation control is thus difficult to realize. As a specific example, there can be cited a MEMS (Micro-Electro Mechanical System) transducer, a practical application of which has been increasingly studied. Since a size and cost of the MEMS transducer can be made small as compared with those of the crystal transducer, the MEMS transducer is expected to serve as an alternative device to the crystal transducer. However, the MEMS transducer has a drawback of having an inferior temperature characteristic as compared with the crystal transducer. For example, as for a silicon transducer that is one of the MEMS transducers, a primary coefficient of the temperature characteristic is about −30 ppm/° C., and temperature detection accuracy Z required for the frequency compensation control is "Z≤0.0022° C." in the case of "$\Delta$fmax=50 Hz". Since the temperature sensor with this temperature detection accuracy is difficult to realize, the drawback has thus been one of disincentives in applying the MEMS transducer, such as a small-sized, low-cost silicon transducer, to a high-frequency receiving device such as a broadcast receiving device.

In synthesizer 1 of Embodiment 1, attention is focused on that a minimum control unit of a frequency division ratio of frequency divider 2d is sufficiently small as compared with a frequency control unit determined from temperature detection accuracy Z, and a controlled amount for frequency divider 2d is decided based not on an absolute value of the detected temperature, but on a time change in detected temperature, so that the frequency compensation control can be performed where deterioration in processing performance of signal processing unit 23 is suppressed.

Hereinafter, a specific method for the frequency compensation control in accordance with Embodiment 1 is described. Differentiation unit 4b outputs temperature change VT (° C./sec) per unit time based on a digitalized temperature outputted from AD converter 4a. Frequency converter 4c multiples Vt by temperature characteristic X (ppm/° C.) of reference oscillator 6, to calculate a time change rate (ppm/sec) of a variation in frequency of the reference oscillation signal. The calculated value is further multiplied by frequency Fvco (Hz) of the oscillation signal, so as to obtain time change rate Vvco (Hz/sec) of the amount of variation in frequency of the oscillation signal. Specifically, time change rate Vvco (Hz/sec) of the oscillation signal is expressed by (Equation 3):

$$V\text{vco} = VT \times X \times F\text{vco} \qquad \text{(Equation 3).}$$

Control unit 5 controls the frequency division ratio of frequency divider 2d such that the time change rate of the oscillation signal is "−Vvco", to perform the frequency compensation control. Thereby, the time change rate of the frequency of the oscillation signal, which is attributed to the temperature change, is offset by the time change rate of the frequency of the oscillation signal, which is attributed to the control of the frequency division ratio. When the minimum unit of the change by frequency divider 2d is Fmin (Hz), control unit 5 may just add a frequency division ratio of Mstep expressed by (Equation 4) with respect to each control period T (sec):

$$M\text{step}=INT(V\text{vco}\times T/F\text{min}) \quad \text{(Equation 4).}$$

Herein, INT(X) represents an integer obtained by performing rounding or the like on X. From (Equation 4), it is necessary to make minimum change unit Fmin of frequency divider $2d$ smaller than "Vvco×T". As a technique for making Fmin smaller, there are fractional frequency dividing systems, such as a fractional N system and a $\Delta\Sigma$ system. For example, in the case of using the $\Delta\Sigma$ system, when the number of bits of an accumulator (not shown) included in frequency divider $2d$ is N, Fmin is expressed by (Equation 5), using frequency Fref of the reference oscillation signal:

$$F\text{min}=F\text{ref}/(2^N) \quad \text{(Equation 5).}$$

Therefore, by making N large, minimum change unit Fmin can be made significantly small.

With the above control, even in the case of using reference oscillator 6 made up of a transducer with an inferior temperature characteristic, control unit 5 can make the frequency of the oscillation signal, outputted from synthesizer 1, smaller than required variation ratio R. This state is described with reference to FIG. 3.

Figure 3:
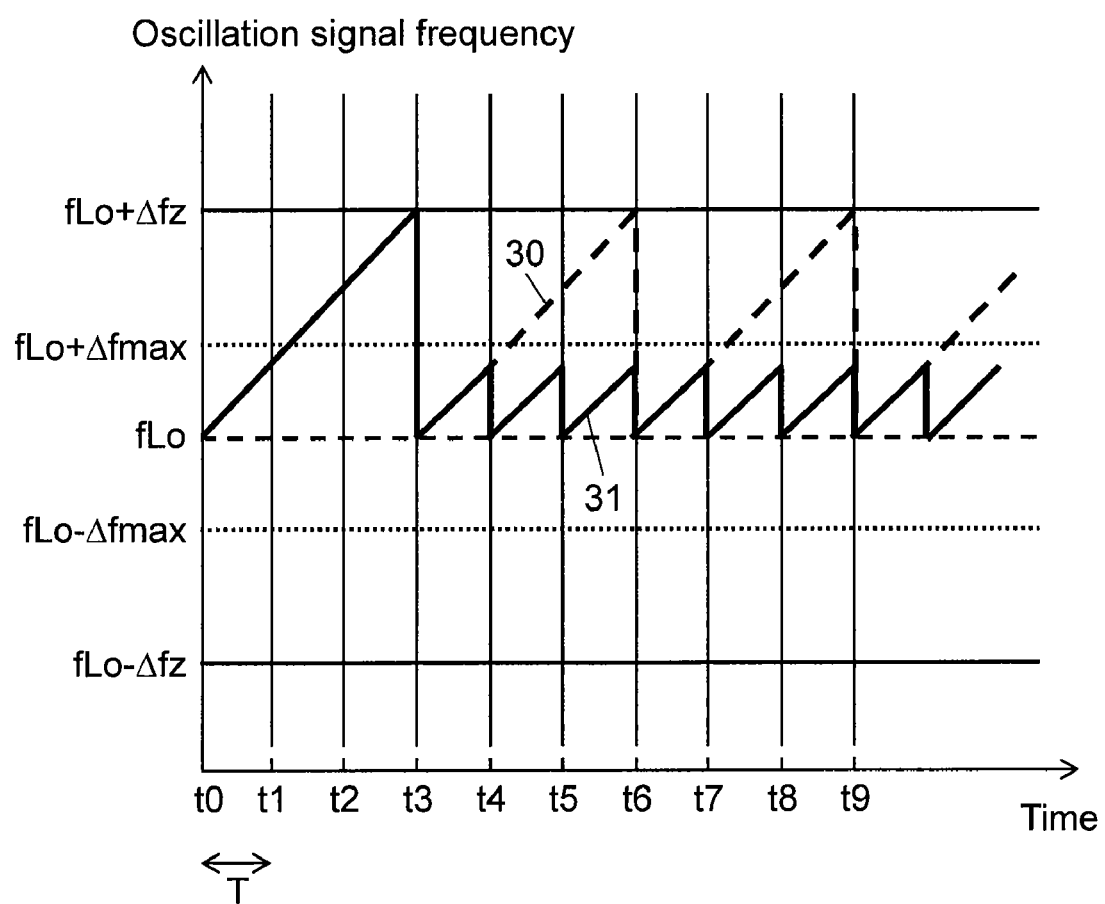
FIG. 3 is an explanatory diagram of an oscillation signal frequency of the synthesizer in Embodiment 1 of the present invention.

FIG. 3 is an explanatory view of the oscillation signal frequency of the synthesizer in Embodiment 1 of the present invention. In FIG. 3, a horizontal axis represents the time, and a vertical axis represents the frequency. Further, conventional oscillation signal 30 represents a variation in frequency of the oscillation signal in the case of performing conventional control, and oscillation signal 31 of the present application represents a variation in frequency of the oscillation signal in the case of performing control of the present invention. It is assumed that in an initial state (t=t0), conventional oscillation signal 30 and oscillation signal 31 of the present application have desired oscillation frequencies (fLo). When an allowable frequency deviation of signal processing unit 23 is $\Delta$fmax, reception quality deteriorates in the case of frequency f of the oscillation signal not satisfying (Equation 6):

$$(fLo-\Delta fmax)<f<(fLo+\Delta fmax) \quad \text{(Equation 6).}$$

Control unit 68 in conventional synthesizer 60 reads from nonvolatile memory 67 a frequency division ratio corresponding to a temperature detected by temperature detecting unit 65, and sets the frequency division ratio into frequency divider 64, whereby temperature detection accuracy Z (° C.) of temperature detecting unit 65 limits frequency control accuracy. Specifically, frequency control unit $\Delta$fz of the oscillation signal outputted from synthesizer 60 is expressed by (Equation 7):

$$\Delta fz=X \times Z \times F\text{vco} \quad \text{(Equation 7).}$$

In FIG. 3, control unit 68 operates in control cycle T, but with the minimum control unit being $\Delta$fz, control unit 68 can control the frequency division ratio of frequency divider 64 just at timings of t3, t6, and t9, and cannot control the ratio at timings of t1, t2, and the like. Consequently, conventional oscillation signal 30 varies in a range of $\pm\Delta$fz, and does not satisfy the condition of (Equation 6), leading to deterioration in reception quality.

Time variation detecting unit 4 in synthesizer 1 of Embodiment 1 can calculate by (Equation 8) the time change rate of the amount of variation in frequency of the oscillation signal, based on detected temperatures at t0 and t3:

$$V\text{vco}=\Delta fz/(t3-t0) \quad \text{(Equation 8).}$$

Based on Vvco, at the time points of t4 and t5, control unit 5 adds frequency division ratio Mstep expressed by (Equation 4) to the frequency division ratio set in frequency divider $2d$.

As a consequence, oscillation signal 31 of the present application can perform the frequency compensation control in units not larger than frequency control unit $\Delta$fz which is limited by temperature detection accuracy Z. This can hold the variation in frequency of the oscillation signal at or below $\pm\Delta$fmax, so as to control deterioration in reception quality. Further, since the temperature detected by temperature detecting unit 3 changes at t6, an added amount of the frequency division ratio after t7 may be decided based on the detected temperatures at t0, t3 and t6.

In the foregoing description, the inclination of the change in frequency (first-order differential value) calculated from the temperature detection result is used, but further considering a second-order differential value can enhance followability with respect to the case of a temporal change in inclination of the change in frequency. Moreover, in such a manner that the temperature detection result is subjected to movement averaging processing or sliding averaging processing added with predetermined weight, and time change rate Vvco of the amount of variation in frequency is then calculated, it is possible to remove effects exerted by a short-period variation in temperature and variations in measurement so as to perform stable control.

It should be noted that the present invention is characterized by performing the frequency compensation control in smaller units than the frequency control accuracy limited by temperature detection accuracy Z, based on the time variation in frequency. Accordingly, the calculation method for Vvco in time variation detecting unit 4 is not restricted to the foregoing differentiation and the like, but a term proportional to the current detected temperature, or an integration term calculated from the past detected temperature, may further be added.

Moreover, as shown in FIG. 2, the use of synthesizer 1 in Embodiment 1 enables configuration of receiving device 20 that suppresses deterioration in reception quality in signal processing unit 23 in a subsequent stage by means of reference oscillator 6 using a transducer with an inferior temperature characteristic, such as the MEMS transducer.

Furthermore, provision of signal processing unit 23 and a display unit (not shown) in a stage subsequent thereto enables configuration of small-sized electronic equipment using the MEMS transducer and the like.

(Embodiment 2)

Figure 4:
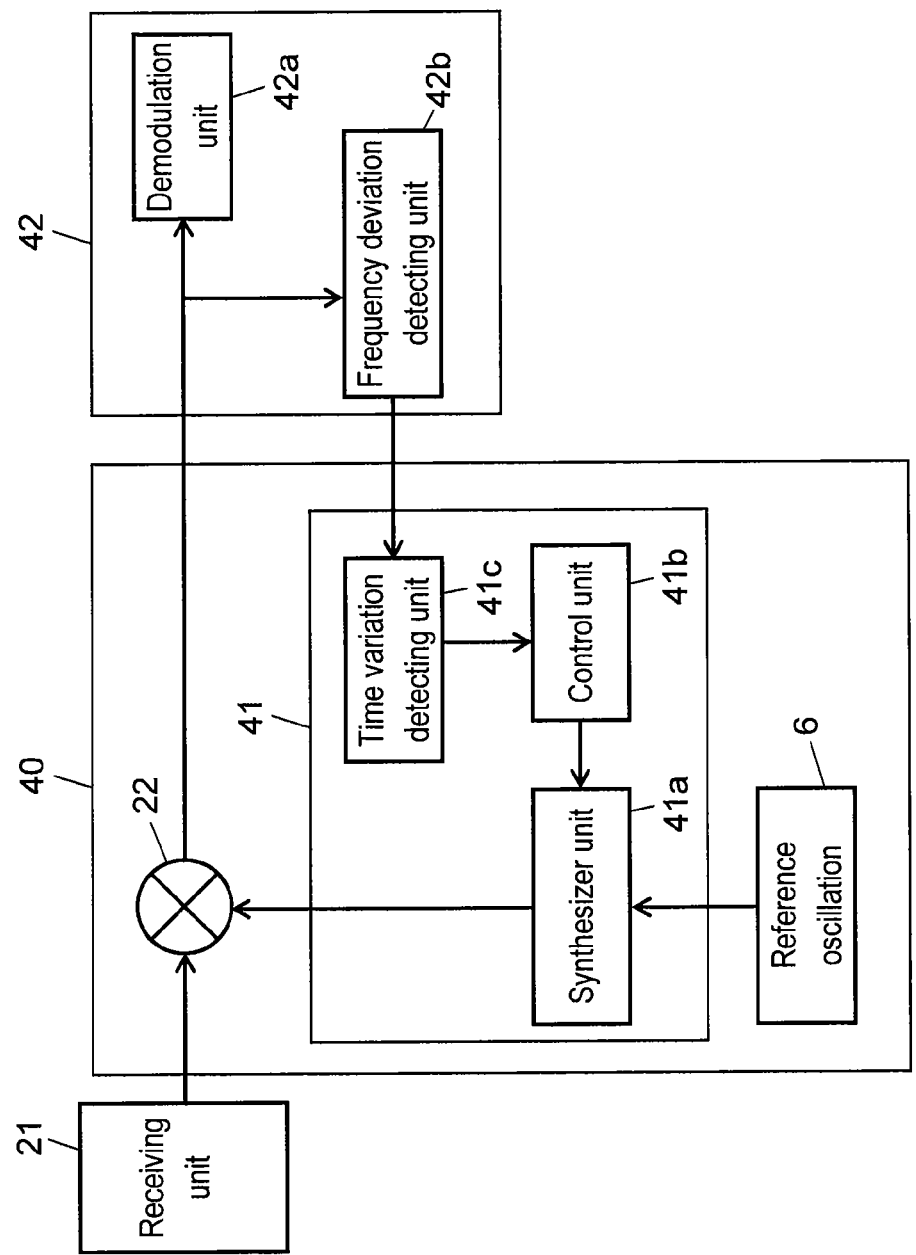
FIG. 4 is a block diagram of a receiving device mounted with a synthesizer in Embodiment 2 of the present invention.

FIG. 4 is a block diagram of a receiving device mounted with a synthesizer in Embodiment 2 of the present invention. In FIG. 4, synthesizer 41 has: synthesizer unit 41a that outputs an oscillation signal based on a reference oscillation signal outputted from reference oscillator 6; time variation detecting unit 41c that detects a time variation in frequency of the oscillation signal outputted from synthesizer 41, based on a frequency deviation inputted from an outside; and control unit 41b that adjusts the frequency of the oscillation signal based on the time variation. Further, receiving device 40 has: reference oscillator 6; synthesizer 41; and frequency converter 22 that converts a received signal outputted from receiving unit 21 to a frequency based on the oscillation signal outputted from synthesizer 41, and outputs a BB signal. Further, signal processing unit 42 has demodulation unit 42a that processes the BB signal, and frequency deviation detecting unit 42b that outputs a frequency deviation of the BB signal.

Hereinafter, a method for detecting the frequency deviation of the BB signal is described, and a method for performing the frequency compensation control based on a time variation in this frequency deviation is described.

Frequency deviation detecting unit 42b can detect the frequency deviation by means of a known reference signal (e.g. guard interval signal) in transmission/reception, which is inserted into the BB signal, or a characteristic of a modulated waveform. In the example of the ISDB-T, there are used two frequency deviation calculating circuits which are a wide-band carrier frequency deviation calculating circuit (not shown), and a narrow-band carrier frequency deviation calculating circuit (not shown). The wide-band carrier frequency deviation calculating circuit can calculate a frequency deviation in carrier-interval units by use of a reference symbol for frequency synchronization, having been inserted in a predetermined cycle on the transmission side. Therefore, a detected range of the wide-band carrier frequency deviation calculating circuit is a transmission band width, and detection accuracy of the frequency deviation is about 1 kHz (in the case of Mode 3). Further, in the narrow-band carrier frequency deviation calculating circuit, since a guard-period signal in an OFDM signal is a copy of a rear portion of an effective-symbol-period signal, by utilizing the correlation therebetween, a frequency deviation within the carrier-interval is detected. In this narrow-band carrier frequency deviation calculating circuit, a detected range can be set to a carrier-interval (about 1 kHz), and detection accuracy can be set within 1% (about 10 Hz) of the carrier-interval. Frequency deviation detecting unit 42b can detect a wide-range frequency deviation with high accuracy by use of the wide-band carrier frequency deviation calculating circuit and the narrow-band carrier frequency deviation calculating circuit.

Herein, when a detection cycle of frequency deviation detecting unit 42b is slow as compared with a frequency variation velocity, it is not possible to follow the variation in frequency by the frequency compensation control based on the frequency deviation. In the case of the ISDB-T, since a reference symbol for use in the wide-band carrier frequency deviation calculating circuit and an effective-symbol-period signal for use in the narrow-band carrier frequency deviation calculating circuit are obtained at an interval of about 1 millisecond (in the case of Mode 3), the detection cycle cannot be made shorter than 1 millisecond. Moreover, in practice, averaging processing for alleviating variations in detection is performed, thereby to make the detection cycle several tens to several hundreds of milliseconds. Accordingly, when the variation in frequency within the detection cycle exceeds allowable frequency deviation $\Delta fmax$ that is determined in accordance with processing performance of demodulation unit 42a, the reception quality deteriorates.

In synthesizer 41 in Embodiment 2, time variation detecting unit 41c performs time differentiation on the frequency deviation outputted from frequency deviation detecting unit 42b, thereby to detect the time change rate of the frequency deviation of the oscillation signal outputted from synthesizer 41. Then, based on this time change rate, the frequency compensation control can be performed in a shorter cycle than the detection cycle.

Hereinafter described is the method for the frequency compensation control in synthesizer 41 in Embodiment 2.

Frequency deviation $\Delta f(t)$ detected by frequency deviation detecting unit 42b is expressed by (Equation 9), using frequency deviation $\Delta fRf(t)$ possessed by the received signal, and frequency deviation $\Delta fLo(t)$ of the oscillation signal outputted from synthesizer 41:

$$\Delta f(t) = \Delta fRf(t) + \Delta fLo(t) \quad \text{(Equation 9)}.$$

When both sides are divided by detection cycle $\Delta t$, (Equation 10) is given:

$$\Delta f(t)/\Delta t = \Delta fRf(t)/\Delta t + \Delta fLo(t)/\Delta t \quad \text{(Equation 10)}.$$

Herein, since an oscillator excellent in frequency stability, such as an OCXO, is generally used in a transmitter in a broadcasting station, the time variation in transmit frequency is sufficiently small. It is thus possible to set "$\Delta fRf(t)/\Delta t$" in the first term to zero, so as to take "$\Delta f(t)/\Delta t$" calculated by time variation detecting unit 41c as frequency variation "$\Delta fLo(t)/\Delta t$" of the oscillation signal.

Accordingly, control unit 41b may decide an adjustment velocity of synthesizer unit 41a such that the frequency of the oscillation signal becomes zero, based on "$\Delta f(t)/\Delta t$" outputted from time variation detecting unit 41c.

Figure 5:
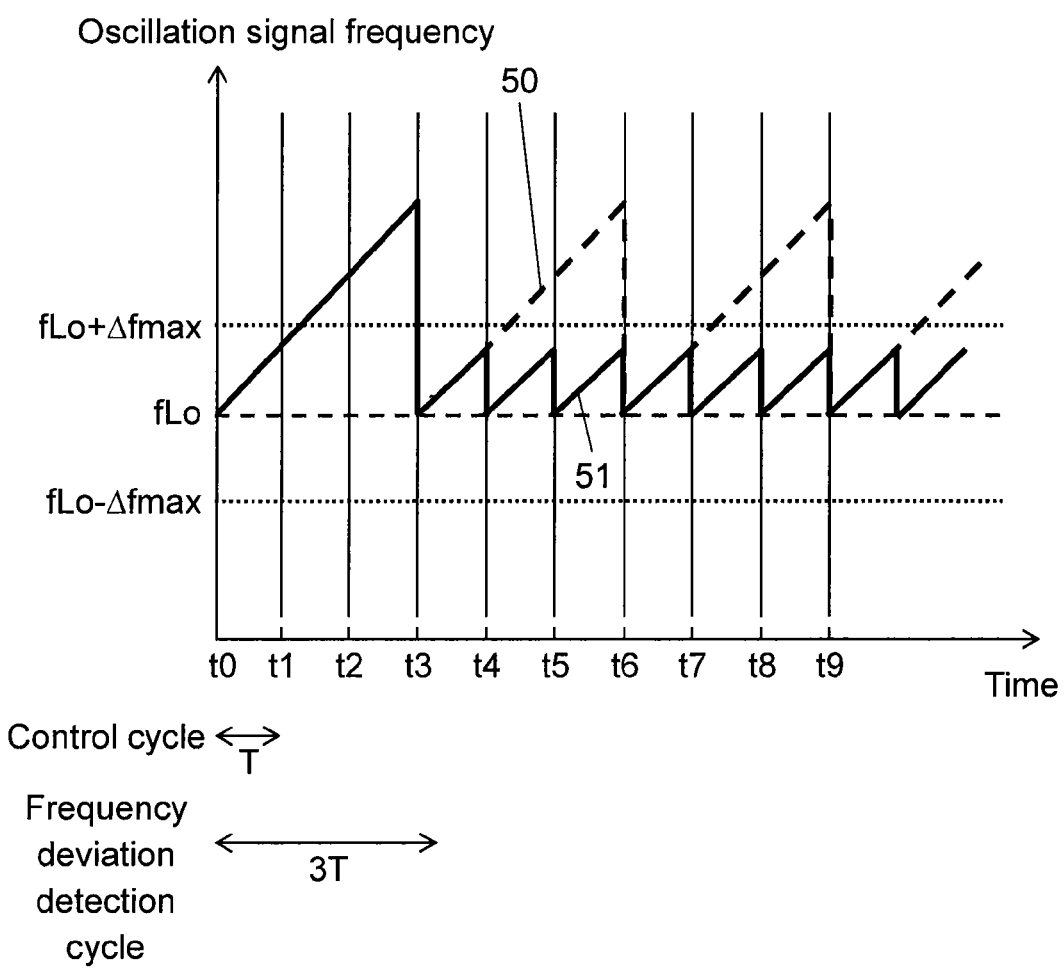
FIG. 5 is an explanatory diagram of an oscillation signal frequency of the synthesizer in Embodiment 2 of the present invention.
Figure 6:
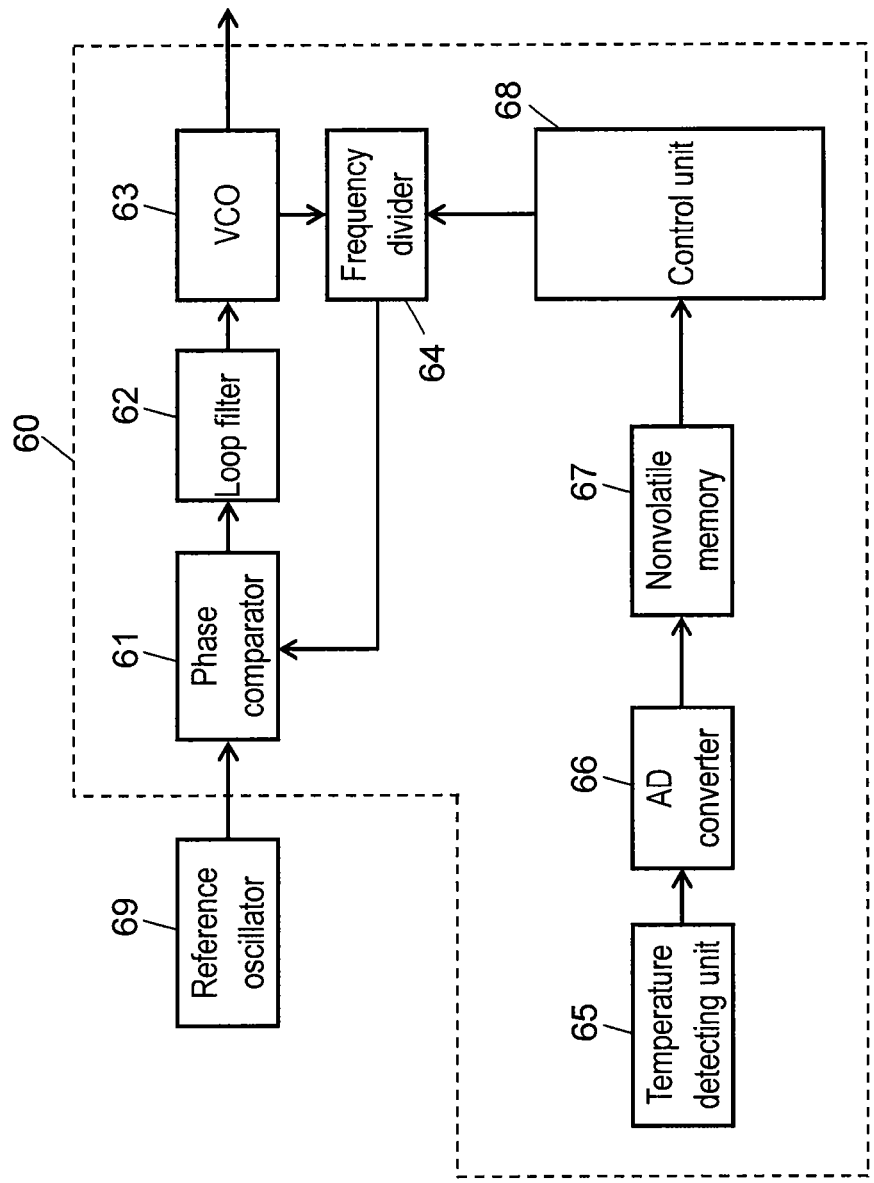
FIG. 6 is a block diagram of a conventional synthesizer.

The variation in frequency of the oscillation signal in Embodiment 2 is described with reference to FIG. 5. FIG. 5 is an explanatory view of the oscillation signal frequency of the synthesizer in Embodiment 2 of the present invention. In FIG. 5, a horizontal axis represents the time, and a vertical axis represents the frequency. A control cycle of control unit 41b is T, and the detection cycle of the frequency deviation is 3 T. Conventional oscillation signal 50 represents a variation in frequency of the oscillation signal in the case of controlling synthesizer unit 41a based on an absolute value of the frequency deviation outputted from frequency deviation detecting unit 42b. Further, oscillation signal 51 of the present application represents a variation in frequency of the oscillation signal in the case of performing control in the present embodiment.

With conventional oscillation signal 50, the frequency compensation control can only be performed in 3 T (t0, t3, t6, . . . ) which is a slower cycle than the control cycle. For this reason, the frequency deviation of the oscillation signal exceeds $\Delta fmax$, having brought about deterioration in reception quality.

On the other hand, with oscillation signal 51 of the present application, the time change rate of the frequency deviation of the oscillation signal is detected based on the frequency deviations detected at t0 and t3. Then, based on this time change rate, the frequency compensation control can be performed in cycle T after T4. It is thus possible to hold the frequency deviation of the oscillation signal at or below $\Delta fmax$, so as to suppress deterioration in reception quality. Further, with a frequency deviation being newly outputted from frequency deviation detecting unit 42b at t6, an added amount of the frequency division ratio after t7 may be decided based on the detected temperatures at t0, t3 and t6.

Industrial Applicability

The synthesizer of the present invention can be utilized in a receiving device and electronic equipment.

Reference Marks in the Drawings

1, 41 synthesizer
2, 41a synthesizer unit
2a phase comparator
2b loop filter
2c VCO
2d frequency divider
3 temperature detecting unit
4, 41c time variation detecting unit
4a AD converter
4b differentiation unit
4c, 22 frequency converter
5, 41b control unit
6 reference oscillator
20, 40 receiving device
21 receiving unit
23, 42 signal processing unit
30, 50 conventional oscillation signal 31, 51 oscillation signal of present application
42a demodulation unit
42b frequency deviation detecting unit

The invention claimed is:
1. A receiving device, comprising:
a frequency converter that converts a received signal to a frequency;
a reference oscillator that outputs a reference oscillation signal;
a synthesizer unit that supplies the frequency converter with an oscillation signal based on the reference oscillation signal outputted from the reference oscillator;
a temperature detecting unit that detects a temperature;
a time variation detecting unit that detects a time variation in frequency of the reference oscillation signal based on a result of temperature detection by the temperature detecting unit; and
a control unit that adjusts a frequency of the oscillation signal outputted from the synthesizer unit based on a result of detection by the time variation detecting unit, wherein
the reference oscillator is provided with a MEMS transducer.

2. Electronic equipment, comprising:
a receiving device according to claim 1;
a signal processing unit that is connected to an output side of the frequency converter; and
a display unit that is connected to an output side of the signal processing unit.

3. A receiving device, comprising:
a frequency converter that converts a received signal to a frequency;
a reference oscillator that outputs a reference oscillation signal;
a synthesizer unit that supplies the frequency converter with an oscillation signal based on the reference oscillation signal outputted from the reference oscillator;
a time variation detecting unit that detects a time variation in frequency of the reference oscillation signal based on an output signal of the frequency converter; and
a control unit that adjusts a frequency of the oscillation signal outputted from the synthesizer unit based on a result of detection by the time variation detecting unit, wherein
the reference oscillator is provided with a MEMS transducer.

4. The receiving device according to claim 3, wherein
the time variation detecting unit detects a time variation in frequency of the reference oscillation signal based on a reference symbol included in an output signal of the frequency converter.

5. The receiving device according to claim 3, wherein
the time variation detecting unit detects a time variation in frequency of the reference oscillation signal based on a guard interval signal included in an output signal of the frequency converter.

6. Electronic equipment, comprising:
a receiving device according to claim 3;
a signal processing unit that is connected to an output side of the frequency converter; and
a display unit that is connected to an output side of the signal processing unit.

7. Electronic equipment, comprising:
a receiving device including
a frequency converter that converts a received signal to a frequency,
a reference oscillator that outputs a reference oscillation signal,
a synthesizer unit that supplies the frequency converter with an oscillation signal based on the reference oscillation signal outputted from the reference oscillator,
a temperature detecting unit that detects a temperature,
a time variation detecting unit that detects a time variation in frequency of the reference oscillation signal based on a result of temperature detection by the temperature detecting unit, and
a control unit that adjusts a frequency of the oscillation signal outputted from the synthesizer unit based on a result of detection by the time variation detecting unit;
a signal processing unit that is connected to an output side of the frequency converter; and
a display unit that is connected to an output side of the signal processing unit.

8. A receiving device, comprising:
a frequency converter that converts a received signal to a frequency;
a reference oscillator that outputs a reference oscillation signal;
a synthesizer unit that supplies the frequency converter with an oscillation signal based on the reference oscillation signal outputted from the reference oscillator;
a time variation detecting unit that detects a time variation in frequency of the reference oscillation signal based on an output signal of the frequency converter; and
a control unit that adjusts a frequency of the oscillation signal outputted from the synthesizer unit based on a result of detection by the time variation detecting unit, wherein
the time variation detecting unit detects a time variation in frequency of the reference oscillation signal based on a reference symbol included in an output signal of the frequency converter.

9. A receiving device, comprising:
a frequency converter that converts a received signal to a frequency;
a reference oscillator that outputs a reference oscillation signal;
a synthesizer unit that supplies the frequency converter with an oscillation signal based on the reference oscillation signal outputted from the reference oscillator;
a time variation detecting unit that detects a time variation in frequency of the reference oscillation signal based on an output signal of the frequency converter; and
a control unit that adjusts a frequency of the oscillation signal outputted from the synthesizer unit based on a result of detection by the time variation detecting unit, wherein
the time variation detecting unit detects a time variation in frequency of the reference oscillation signal based on a guard interval signal included in an output signal of the frequency converter.

10. Electronic equipment, comprising:
a receiving device including
a frequency converter that converts a received signal to a frequency,
a reference oscillator that outputs a reference oscillation signal,
a synthesizer unit that supplies the frequency converter with an oscillation signal based on the reference oscillation signal outputted from the reference oscillator, a time variation detecting unit that detects a time variation in frequency of the reference oscillation signal based on an output signal of the frequency converter, and a control unit that adjusts a frequency of the oscillation signal outputted from the synthesizer unit based on a result of detection by the time variation detecting unit;

a signal processing unit that is connected to an output side of the frequency converter; and a display unit that is connected to an output side of the signal processing unit.

* * * * *